US011175327B2

(12) United States Patent
Nakamura et al.

(10) Patent No.: US 11,175,327 B2
(45) Date of Patent: Nov. 16, 2021

(54) RADIATED EMISSION MEASUREMENT METHOD AND RADIATED EMISSION MEASUREMENT SYSTEM

(71) Applicant: TOYO CORPORATION, Tokyo (JP)

(72) Inventors: Tetsuya Nakamura, Tokyo (JP); Naoki Tsuboi, Tokyo (JP)

(73) Assignee: TOYO CORPORATION, Tokyo (JP)

( * ) Notice: Subject to any disclaimer, the term of this patent is extended or adjusted under 35 U.S.C. 154(b) by 399 days.

(21) Appl. No.: 16/467,791

(22) PCT Filed: Apr. 20, 2018

(86) PCT No.: PCT/JP2018/016285
§ 371 (c)(1),
(2) Date: Jun. 7, 2019

(87) PCT Pub. No.: WO2019/202732
PCT Pub. Date: Oct. 24, 2019

(65) Prior Publication Data
US 2021/0325438 A1    Oct. 21, 2021

(51) Int. Cl.
*G01R 31/00*    (2006.01)
*G01R 23/16*    (2006.01)

(52) U.S. Cl.
CPC .......... *G01R 31/001* (2013.01); *G01R 23/16* (2013.01)

(58) Field of Classification Search
CPC .............................. G01R 31/001; G01R 23/16
(Continued)

(56) References Cited

U.S. PATENT DOCUMENTS 6,509,742 B1    1/2003 Ebizuka et al.
2009/0302829 A1    12/2009 Kanoh et al.
(Continued)

FOREIGN PATENT DOCUMENTS

JP    2001-305168    10/2001
JP    2005-257285    9/2005
(Continued)

OTHER PUBLICATIONS

International Search Report (ISR) dated Jul. 17, 2018 in International (PCT) Application No. PCT/JP2018/016285.
(Continued)

*Primary Examiner* — Giovanni Astacio-Oquendo
(74) *Attorney, Agent, or Firm* — Wenderoth, Lind & Ponack, L.L.P.

(57) ABSTRACT

A radiated emission measurement method includes a prescan measurement step of performing broadband measurement including detection of a peak and detection of a quasi-peak by one fast Fourier transform in a target measurement frequency range; a calculation step of calculating a difference in level between the peak and the quasi-peak obtained for a measurement frequency to be a candidate for a result of measurement; a determination step of determining whether the obtained difference is less than a reference value; and an output step of outputting a result obtained as an interference level of the radiated emission in the broadband measurement when it is determined that the difference is less than reference value, and performing narrowband measurement and outputting the obtained result as the interference level of the radiated emission, when it is determined that the difference is equal to or higher than the reference value.

6 Claims, 7 Drawing Sheets

(58) Field of Classification Search
USPC .......................................... 324/627, 612, 600
See application file for complete search history.

(56) References Cited

U.S. PATENT DOCUMENTS

| | | | |
|---|---|---|---|
| 2012/0226463 A1* | 9/2012 | Keller, III | G06F 21/73 |
| | | | 702/117 |
| 2017/0276712 A1* | 9/2017 | Midori | G01R 29/0892 |
| 2019/0229817 A1* | 7/2019 | Axmon | H04B 7/0874 |

FOREIGN PATENT DOCUMENTS

| | | |
|---|---|---|
| JP | 2007-33197 | 2/2007 |
| JP | 2011-95221 | 5/2011 |
| JP | 2017-146272 | 8/2017 |
| WO | 2008/023640 | 2/2008 |

OTHER PUBLICATIONS

"EMC Compliance Testing: Improve Throughput with Time Domain Scanning", Keysight Technologies, Oct. 27, 2014, with English version.

* cited by examiner

FIG. 3

―CISPR16-2-3 Ed.4(2016)

》 Annex E (normative): method of determining conformance of spectrum analyzer for compliance test 》 Pulse having repetition frequency of 20 Hz or more can be measured using QP detector of spectrum analyzer without preselector.

》 User must prove compliance of pulse response characteristics at repetition frequency of 20 Hz or more in spectrum analyzer to be used.

》 Method for proving is as shown below.
  Check that level difference between PK detector and QP detector is equal to or lower than values in Table below.
  (Band A: 9kHz-150kHz, Band B: 150kHz-30MHz, Band C: 30-300MHz, Band D: 300MHz-1000MHz)

Table

| Band A | Band B | Bands C and D |
|--------|--------|---------------|
| 7 dB   | 13 dB  | 21 dB         |

RADIATED EMISSION MEASUREMENT METHOD AND RADIATED EMISSION MEASUREMENT SYSTEM

TECHNICAL FIELD

The present disclosure relates to radiated emission measurement methods and radiated emission measurement systems, and particularly relates to a radiated emission measurement method suitable for determination of conformance to CISPR standards which require pulse response characteristics.

BACKGROUND ART

The electromagnetic waves radiated from electronic apparatuses and devices may cause electro-magnetic interference (EMI) which disturbs the functions of other electronic apparatuses and devices. For this reason, official organizations, such as the International Special Committee on Radio Interference (CISPR) and the American National Standards Institute (ANSI), formulate EMI-related industrial standards (hereinafter, also simply referred to as "standards"), and governmental organizations in the United States, China, Japan, and others regulate the level of EMI. For example, CISPR 32 standards specify the tolerance of the level thereof in each of detections of a peak, a quasi-peak, an average, and the like of EMI. The determination of conformance is performed based on whether the tolerance is satisfied or not.

A variety of techniques to efficiently perform radiated emission measurement have been proposed in the related art (for example, see Patent Literature 1). Patent Literature 1 discloses measurement of a radiated emission from an equipment under test using an EMI receiver of a fast Fourier transform (FFT) system. Unlike a traditional EMI receiver of a superheterodyne system (so-called sweep system in which sweep from a low frequency region to a high frequency region is repeated), the EMI receiver of a fast Fourier transform system eliminates sweep in the measurement frequency range, resulting in advantages such that high-quality measurement is enabled without missing impulsive noise, and further data by peak (hereinafter, also referred to as "PK") detection, that by quasi-peak (hereinafter, also referred to as "QP") detection, that by average (hereinafter, also referred to as "AV") detection, and the like can be obtained at the same time (in other words, the measurement can be performed in a significantly short time).

CITATION LIST

Patent Literature

[PTL 1] WO2008/023640

SUMMARY OF INVENTION

Technical Problem

Unfortunately, the measurement of the radiated emission using the EMI receiver of a fast Fourier transform system disclosed in Patent Literature 1 requires measurement in a broadband fast Fourier transform bandwidth, leading to determination of conformance where the pulse response characteristics required by the CISPR 16-1-1 standards cannot be satisfied. Herein, the fast Fourier transform bandwidth refers to a frequency bandwidth which enables one fast Fourier transform by the EMI receiver of a fast Fourier transform system. The broadband fast Fourier transform bandwidth usually refers to a bandwidth of 1 MHz or more, such as 50 MHz, 100 MHz, or 500 MHz. In the measurement at a fast Fourier transform bandwidth of 500 MHz, the measurement frequency range of 30 MHz to 1000 MHz required by the standards can be completed by two-range measurement (in which the measurement frequency range is divided into two frequency bands).

In the pulse response characteristics required by the CISPR 16-1-1 standards, the lowest pulse repetition frequency up to 1 Hz is specified for response in quasi-peak detection. At 1 Hz, the quasi-peak detection has a value of 40 dB lower than that in the peak detection. Such a requirement for the pulse response characteristics indicates the necessity of a sufficiently broad dynamic range. To ensure a broad dynamic range, a preselector, which is a bandwidth restriction filter for cutting a signal out of the measurement bandwidth from an input signal to perform processing to prevent decay of a signal within the measurement bandwidth, should be used at an input stage of the EMI receiver. However, such a preselector cannot be used because the broadband fast Fourier transform bandwidth should be maintained to perform the measurement in the broadband fast Fourier transform bandwidth. According to the description in the standards, the EMI receiver without using any preselector can be used only in the measurement of the pulse at a pulse repetition frequency of 20 Hz or more.

For this reason, the execution of the determination of conformance which satisfies the pulse response characteristics required by the CISPR 16-1-1 standards using the EMI receiver of a fast Fourier transform system disclosed in Patent Literature 1 requires complex operations to perform measurement in a broadband fast Fourier transform bandwidth by the EMI receiver of a fast Fourier transform system, and check whether the repetition frequency is 20 Hz or more in each of noises beyond a tolerance and each of representative noises close to the tolerance. Furthermore, noises radiated from an equipment under test (EUT) often behave in a complex manner, resulting in difficulties in evaluation of the repetition frequency. For this reason, the measurement in the fast Fourier transform bandwidth having the advantages described above is not performed in the related art; rather, the measurement is performed by sweep of a narrowband filter using an EMI receiver of a broadband superheterodyne system.

Accordingly, an object of the present disclosure is to provide a radiated emission measurement method and a radiated emission measurement system which can automatically perform determination of conformance that completely satisfies pulse response characteristics required by the standards, without any complex and difficult operation even if broadband measurement is performed using an EMI receiver of a fast Fourier transform system.

Solution to Problem

To achieve the object above, the radiated emission measurement method according to one aspect of the present disclosure is a radiated emission measurement method of measuring a radiated emission from an equipment under test in a target measurement frequency range. The method includes: performing broadband measurement on the radiated emission in the target measurement frequency range by one fast Fourier transform by an electro-magnetic interference (EMI) receiver, the broadband measurement being measurement including detection of a peak and detection of a quasi-peak; calculating a difference in level between the peak and the quasi-peak obtained in the performing for a measurement frequency to be a candidate for a result of measurement in the target measurement frequency range; determining whether the difference obtained in the calculating is less than a reference value predetermined corresponding to the measurement frequency; and outputting a result obtained in the broadband measurement as an interference level of the radiated emission when it is determined in the determining that the difference is less than the reference value, and performing narrowband measurement and outputting a result obtained in the narrowband measurement as the interference level of the radiated emission when it is determined in the determining that the difference is equal to or higher than the reference value, the narrowband measurement being measurement by fast Fourier transform by the EMI receiver targeting the measurement frequency in a frequency range narrower than the target measurement frequency range.

Moreover, to achieve the object above, the radiated emission measurement system according to one aspect of the present disclosure is a radiated emission measurement system which measures a radiated emission from an equipment under test in a target measurement frequency range. The radiated emission measurement system includes: an electromagnetic interference (EMI) receiver which performs broadband measurement on the radiated emission in the target measurement frequency range by one fast Fourier transform, the broadband measurement including detection of a peak and detection of a quasi-peak; and a controller connected to the EMI receiver through a communication path. The controller: obtains data from the EMI receiver, the data being obtained in the broadband measurement; calculates, based on the data obtained, a difference in level between the peak and the quasi-peak obtained in the broadband measurement for a measurement frequency to be a candidate for a result of measurement in the target measurement frequency range; determines whether the difference obtained in the calculation is less than a reference value predetermined corresponding to the measurement frequency; and when the controller determines that the difference is less than the reference value, outputs a result obtained in the broadband measurement as an interference level of the radiated emission, and when the controller determines that the difference is equal to or higher than the reference value, controls such that the EMI receiver performs narrowband measurement, obtains a result, which is obtained in the narrowband measurement, from the EMI receiver, and outputs the result as the interference level of the radiated emission, the narrowband measurement being measurement by fast Fourier transform targeting the measurement frequency in a frequency range narrower than the target measurement frequency range.

The present disclosure can be implemented not only as a radiated emission measurement method and a radiated emission measurement system, but also as a program causing a computer to execute the radiated emission measurement method and as a computer-readable recording medium, such as a CD-ROM, on which the program is recorded.

Advantageous Effects of Invention

The present disclosure can implement a radiated emission measurement method and a radiated emission measurement system which can perform determination of conformance that satisfies the pulse response characteristics required by the standards, without any complex and difficult operation.

BRIEF DESCRIPTION OF DRAWINGS

FIG. 3 is a diagram illustrating a method of measurement in the case where a conventional receiver specified in CISPR 16-2-3 (edition 4:2016) standards is used.

DESCRIPTION OF EMBODIMENT

Figure 1:
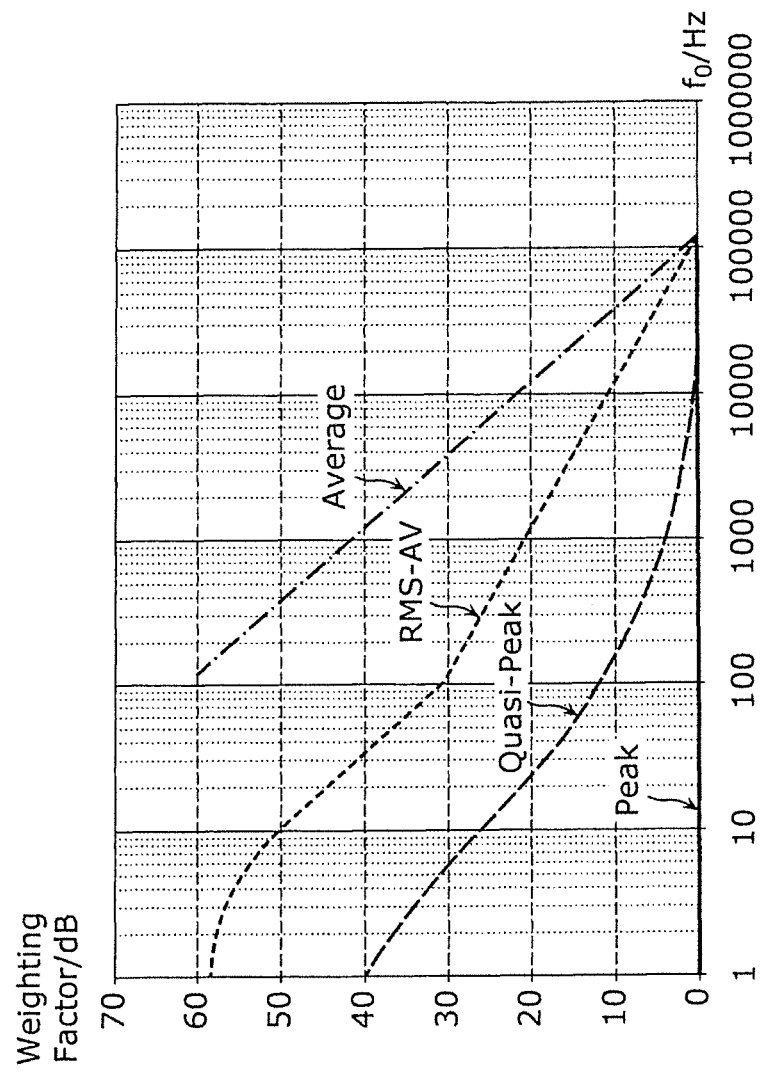
FIG. 1 is a diagram illustrating pulse response characteristics required by CISPR 16-1-1 standards.

[Underlying Knowledge Forming Basis of the Present Disclosure]

The present inventors have achieved a radiated emission measurement method and a radiated emission measurement system which can perform determination of conformance that satisfies the pulse response characteristics required by the standards, without any complex and difficult operation. The underlying knowledge obtained by the present inventors will first be described.

(1) Advantages in Measurement in Broadband Fast Fourier Transform Bandwidth

The radiated emission measurement using an EMI receiver of a fast Fourier transform system enables high-quality measurement without missing impulsive noise (in other words, gapless continuous measurement), compared to the case of an EMI receiver of a traditional superheterodyne system (so-called sweep system). The EMI receiver of a superheterodyne system cannot simultaneously obtain the entire spectrum of the broadband radiated emission because such an EMI receiver measures only one frequency level at each instance during sweep. For example, in an instance where the radiated emission at 200 MHz is measured in the sweep by the EMI receiver of a superheterodyne system, any radiated emission instantaneously occurring in another frequency band (for example, near 180 MHz) (i.e., impulsive noise) cannot be measured, and is dropped. In contrast, in the radiated emission measurement using an EMI receiver of a fast Fourier transform system, high-quality measurement without missing impulsive noise (in other words, gapless continuous measurement) within the fast Fourier transform bandwidth is enabled because signals in the fast Fourier transform bandwidth are simultaneously measured.

Moreover, the radiated emission measurement using the EMI receiver of a fast Fourier transform system provides another advantage over the conventional EMI receiver of a superheterodyne system such that the data by the peak detection method, that by the quasi-peak detection method, that by the average detection method, and the like can be simultaneously obtained (in other words, high-speed measurement is enabled). For example, the quasi-peak detection usually needs a measurement time of at least one second to obtain the level of one frequency. The EMI receiver of a superheterodyne system needs an extremely long time for measurement because it sweeps the measurement frequency range using this quasi-peak detection. In contrast, the EMI receiver of a fast Fourier transform system can complete the measurement by the quasi-peak detection in a significantly short time because the EMI receiver performs the measurement by the quasi-peak detection by performing an arithmetic operation on the signals within the measurement frequency range at one time.

Accordingly, an EMI receiver of a fast Fourier transform system having a broadband fast Fourier transform bandwidth of 500 MHz, for example, can perform high-quality radiated emission measurement in a short time on the measurement frequency range of 30 MHz to 1000 MHz, which is required by the standards, using only two-range measurement (in which the measurement frequency range is divided into two frequency bands), without missing impulsive noise. Alternatively, the measurement is completed only at one time at a fast Fourier transform bandwidth of 1000 MHz.

(2) Disadvantages in Measurement in Broadband Fast Fourier Transform Bandwidth

However, in the measurement in such a broadband fast Fourier transform bandwidth, the EMI receiver no longer satisfies the pulse response characteristics required by the CISPR 16-1-1 standards, and cannot be used in the determination of conformance. In other words, the measurement in the broadband fast Fourier transform bandwidth cannot satisfy the pulse response characteristics required by the standards while enabling high-speed measurement with high reliability.

FIG. 1 is a diagram illustrating the pulse response characteristics required by the CISPR 16-1-1 standards. Here, the diagram shows the level differences in response to peak detection ("Peak"), quasi-peak detection ("Quasi-Peak"), square mean root value detection ("RMS-AV"), and average detection ("Average"). The abscissa indicates the pulse repetition frequency, and the ordinate indicates the difference in level of the peak detection ("Peak") to a response (amount of decay ("Weighting Factor dB")).

Apparently from FIG. 1, the CISPR 16-1-1 standards specifies the pulse response characteristics to the quasi-peak detection at a pulse repetition frequency up to 1 Hz. At 1 Hz, there is a 40 dB difference between the response in the quasi-peak detection and that in the peak detection. Such a requirement on the pulse response characteristics indicates a situation where even if the response in the quasi-peak detection is small, the input attenuation of the input signal to the EMI receiver cannot be reduced (in other words, decay cannot be reduced), and indicates that a sufficiently broad dynamic range is necessary.

To ensure a sufficiently broad dynamic range, a preselector which cuts a signal out of the measurement bandwidth from the input signal to perform processing to prevent decay of a signal within the measurement bandwidth is used at the input stage of the EMI receiver.

Figure 2:
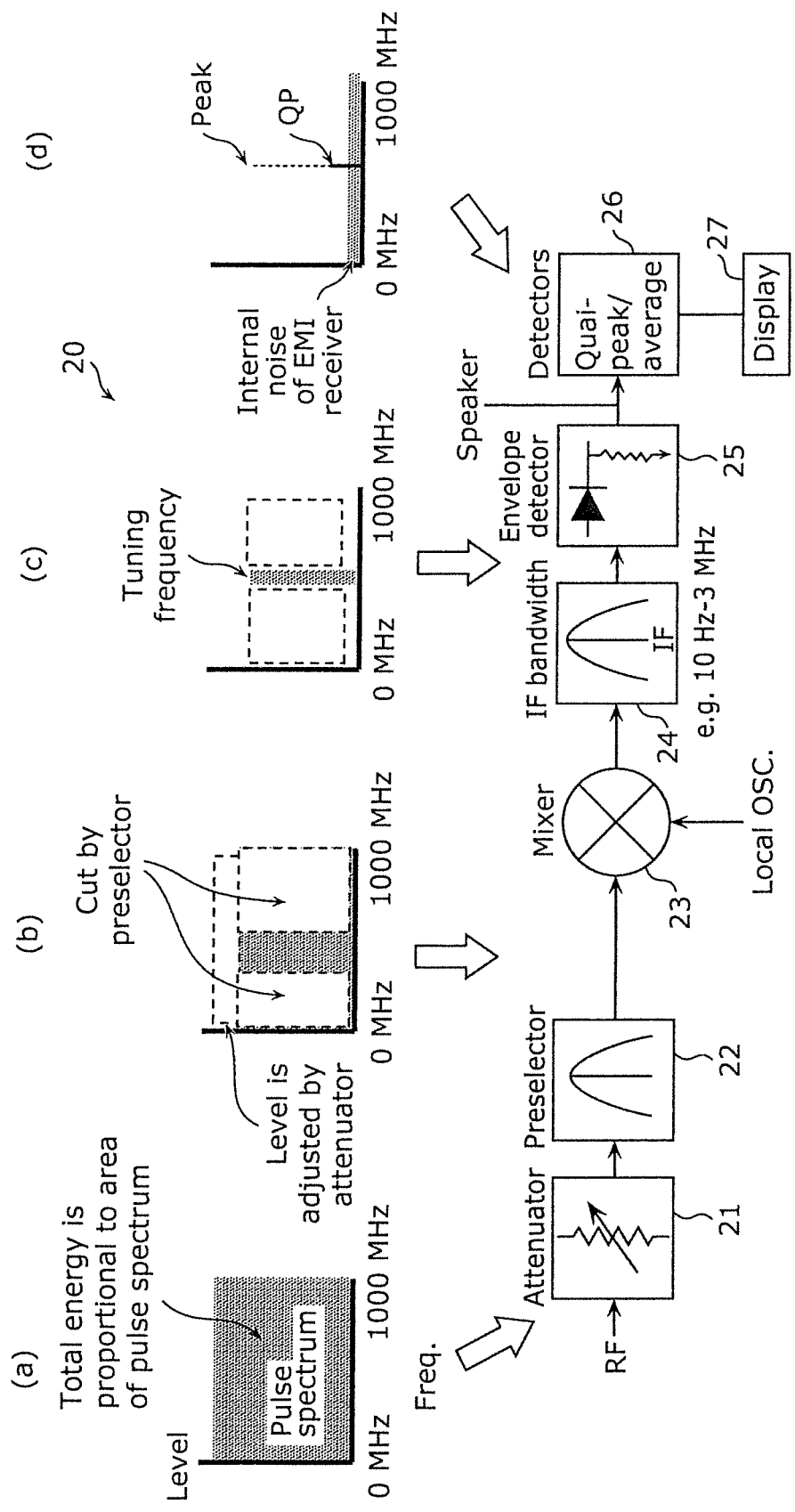
FIG. 2 is a diagram illustrating an EMI receiver which can ensure a dynamic range by using a preselector.

FIG. 2 is a diagram illustrating an EMI receiver which can ensure the dynamic range by using a preselector. Here, this diagram shows the functional blocks of an EMI receiver 20 including a preselector, and the spectra of the processing signal before and after the functional blocks when an impulse as an input signal is input.

As illustrated in FIG. 2, the EMI receiver 20 includes an attenuator 21, a preselector 22, a mixer 23, an intermediate frequency filter 24, a detector 25, detectors 26, and a display 27.

Now, assume that an impulse having a broadband spectrum illustrated in (a) of FIG. 2 is input. After the input impulse decays in the attenuator 21, a signal out of the measurement bandwidth is cut by the preselector 22, and only a signal within the measurement bandwidth passes through the preselector 22 without decay. Thus, a signal having a spectrum illustrated in (b) of FIG. 2 is obtained.

The signal which passes through the preselector 22 is then multiplied by a local signal in the mixer 23 to be converted into a signal having an intermediate frequency illustrated in (c) of FIG. 2 by the intermediate frequency filter 24.

The signal then passes through the detector 25 by the peak detection, the quasi-peak detection, the average detection, and the like, and is input into the detectors 26. The response levels are determined by the detectors 26, and are displayed on the display 27 as measured values by the detection methods, as illustrated in (d) of FIG. 2.

Thus, to measure a pulse having a low repetition frequency, the preselector 22 is used to cut the signal out of the measurement bandwidth and pass only the signal within the measurement bandwidth without decay, thereby preventing saturation at the input stage (i.e., the mixer 23) of the EMI receiver and ensuring the dynamic range needed for the measurement where the pulse response characteristics required by the CISPR 16-1-1 standards are satisfied.

However, a broadband fast Fourier transform bandwidth should be maintained in the measurement in the broadband fast Fourier transform bandwidth, and therefore, a preselector having such a narrowband cannot be used. In other words, the input stage of the EMI receiver reaches a saturated level because a preselector having a broad measurement bandwidth to treat the broadband fast Fourier transform bandwidth should be used.

Consequently, the advantageous effects of the preselector should be reduced in order to increase the fast Fourier transform bandwidth, leading an insufficient dynamic range needed to measure a pulse having a low repetition frequency. As a result, the measurement where the pulse response characteristics required by the CISPR 16-1-1 standards are satisfied cannot be performed.

(3) Solution

The present inventors, who have conducted extensive research, have focused on the following points, and have conceived an automatic measurement method which uses measurement in a broadband fast Fourier transform bandwidth and also enables measurement where the pulse response characteristics required by the CISPR 16-1-1 standards are satisfied.

The present inventors have focused on the following points (i) and (ii).

(i) Although the measurement in the broadband fast Fourier transform bandwidth has possibilities that the pulse response characteristics required by the standards are not satisfied in the case of a pulse having a low repetition frequency, actually, there are not so many equipments under test which generate pulse noise at such a low repetition frequency.

(ii) On the other hand, for the cases of measurement with conventional receivers which partially do not satisfy the standards (i.e., spectrum analyzers which are not EMI-compliant (hereinafter, also simply referred to as "spectrum analyzers")), the CISPR 16-2-3 (edition 4:2016) standards, which specify the pulse response characteristics, specify a method of determining whether appropriate pulse response is performed or not.

FIG. 3 is a diagram illustrating a method of measurement in the case where a conventional receiver specified in the CISPR 16-2-3 (edition 4:2016) standards is used. As illustrated in FIG. 3, the followings (a) to (c) are specified for the pulse having a repetition frequency of 20 Hz or more: (a) Such a pulse can be measured using a quasi-peak detector of a spectrum analyzer without a preselector, (b) a user should prove that the spectrum analyzer to be used is compliant with the pulse response characteristics at a repetition frequency of 20 Hz or more, and (c) in the proof, it is verified that the level difference between the peak detector and the quasi-peak detector is equal to or less than the value shown in FIG. 3 (7 dB at 9 kHz to 150 kHz (Band A), 13 dB at 150 kHz to 30 MHz (Band B), 21 dB at 30 MHz to 300 MHz (Band C), or 21 dB at 300 MHz to 1000 MHz (Band D)).

Actually, the measurement method specified in the CISPR 16-2-3 (edition 4:2016) is not frequently used for the following reasons: A measurer should have some knowledge about radiated emission measurement; in addition, the measurement by the peak detection and the quasi-peak detection needs much time and effort. For these reasons, many users use EMI-compliant receivers (EMI receivers compliant with the standards).

From the two points (i) and (ii) above, the present inventors have conceived as follows.

The above-mentioned measurement method specified in the CISPR 16-2-3 (edition 4:2016) standards using a conventional receiver is utilized in an automatic measurement method by software. In other words, whether the response is appropriate or not is automatically determined to all the noises to be measured. When the response is determined as acceptable, the results of measurement obtained in the measurement in the broadband fast Fourier transform bandwidth are used as the final results of measurement. When the response to the noise is determined as unacceptable, such a noise is subjected to automatic measurement by an EMI receiver of a fast Fourier transform system using a narrowband preselector having a restricted frequency bandwidth.

More specifically, using a variation in deviations of values in the peak detection and the quasi-peak detection according to the pulse repetition frequency, the values in the peak detection and the quasi-peak detection are simultaneously obtained in the measurement in the broadband fast Fourier transform bandwidth using the EMI receiver of a fast Fourier transform system. Whether the deviations have predetermined or higher values is automatically determined. For noises having deviations having predetermined or higher values, the switch of the setting so as to satisfy the requirement by the standards is automatically performed in a traditional receiver mode or a measurement mode in a narrowband fast Fourier transform bandwidth where the preselector can be used. Thus, results which completely satisfy the requirement by the standards are obtained.

Such an automatic measurement method using the measurement in the broadband fast Fourier transform bandwidth provides highly reliable results of measurement in a measurement time approximately equal to or shorter than in the related art without missing noise with full compliance with the standards. In other words, the determination of conformance which satisfies the pulse response characteristics required by the CISPR 16-1-1 standards can be performed without complex and difficult operation.

Embodiment

An embodiment according to the present disclosure based on the knowledge of the present inventors will now be described in detail with reference to the drawings. The embodiment described below illustrates a specific example of the present disclosure. Numeric values, shapes, components, arrangements of components, connection forms thereof, steps, and orders of steps described in the following embodiment are exemplary, and should not be construed as limitative to the present disclosure. Moreover, among the components of the embodiment below, the components not described in an independent claim representing the most superordinate concept of the present disclosure will be described as arbitrary components. The drawings are not always strictly drawn. In the drawings, identical reference numerals are given to substantially identical configurations, and the duplication of description thereof will be omitted or simplified in some cases.

Figure 4:
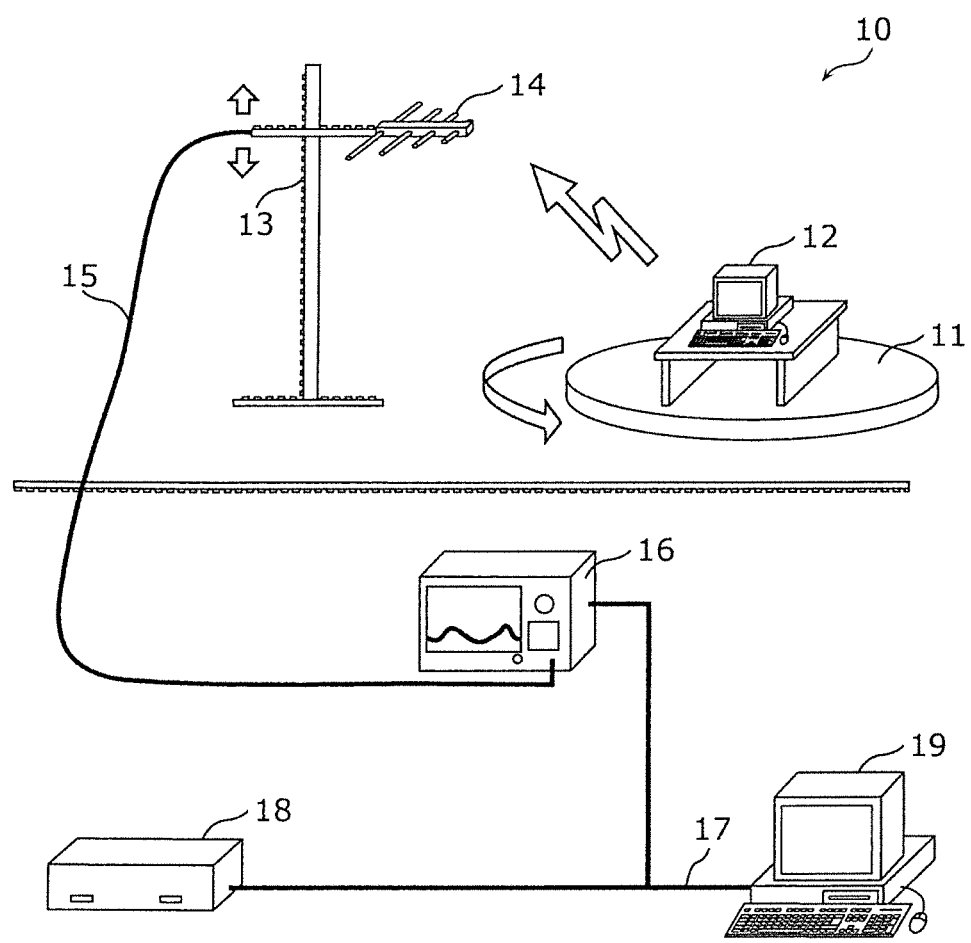
FIG. 4 is a diagram illustrating a configuration of a radiated emission measurement system according to an embodiment.

FIG. 4 is a diagram illustrating a configuration of a radiated emission measurement system 10 according to an embodiment.

The radiated emission measurement system 10 is a measurement system which evaluates EMI in a target measurement frequency range (for example, 100 MHz to 300 MHz), and includes a turntable 11, an antenna mast 13, an antenna 14, a signal cable 15, an EMI receiver 16, a control cable 17, a turntable/antenna mast controller 18, and a controller 19. The diagram also illustrates an equipment 12 under test placed on the turntable 11.

The turntable 11 is rotatable in the state where a non-conductive stand and the equipment 12 under test placed thereon are placed on the turntable 11. The turntable 11 rotates in response to a control signal from the turntable/antenna mast controller 18.

The antenna 14 detects a radiated emission from the equipment 12 under test in at least a measurement frequency range.

The antenna mast 13 is a stand on which the antenna 14 vertically moves. The antenna mast 13 vertically moves the antenna 14 in response to the control signal from the turntable/antenna mast controller 18.

The signal cable 15 transmits an electric signal of the radiated emission detected by the antenna 14 to the EMI receiver 16. The signal cable 15 may include a preamplifier and an RF selector halfway.

The EMI receiver 16 is an EMI receiver of a fast Fourier transform system. In the case where the frequency bandwidth enabling one fast Fourier transform by the EMI receiver 16 is defined as a fast Fourier transform bandwidth, the EMI receiver 16 performs measurement by the fast Fourier transform in the target frequency range (from a frequency (start frequency) to another frequency in the fast Fourier transform bandwidth (end frequency)) specified manually or by external control. For example, the fast Fourier transform bandwidth is 50 MHz, and a start frequency of 0 to 1000 MHz can be specified.

The EMI receiver 16 also includes a filter, and detectors for obtaining the peak, the quasi-peak, the average, and the square mean root value. In other words, the EMI receiver 16 can perform broadband measurement, which is measurement including detection of a peak and detection of a quasi-peak, on the radiated emission in the target measurement frequency range by the one fast Fourier transform.

The EMI receiver 16 also includes broadband and narrowband preselectors as preselectors at an input stage. The broadband preselector is used in the broadband measurement, which is performed by the one fast Fourier transform where the measurement frequency range (here, 50 MHz) is defined as the fast Fourier transform bandwidth. The broadband preselector is a broadband pass filter having a bandwidth (e.g., 80 MHz) through which a signal in the measurement frequency range passes. The narrowband preselector is used in the narrowband measurement by the fast Fourier transform focused on only a specific frequency. The narrowband preselector is a narrowband pass filter having a bandwidth (e.g., 2 MHz) through which only a signal having the specific frequency passes.

In response to an instruction (i.e., external control) received from the controller 19 through the control cable 17, the EMI receiver 16 controls a variety of settings such as the target frequency range for the fast Fourier transform, start and stop of the fast Fourier transform, and output of the results of measurement.

The control cable 17 connects the controller 19 to the EMI receiver 16 and the turntable/antenna mast controller 18, and is a general purpose interface bus (GPIB) cable, for example. The control cable 17 transmits an instruction from the controller 19 to the EMI receiver 16 and the turntable/antenna mast controller 18, or transmits the state information of an apparatus or a device and the results of measurement in the opposite direction.

The turntable/antenna mast controller 18 is a driving controller which controls the turntable 11 and the antenna mast 13. In response to an instruction received from the controller 19 through the control cable 17, the turntable/antenna mast controller 18 controls the rotation of the turntable 11 and vertical movement of the antenna 14 on the antenna mast 13.

The controller 19 controls the EMI receiver 16 and the turntable/antenna mast controller 18 by transmitting an instruction through the control cable 17. This controller is, for example, a personal computer (PC) including memories, such as a ROM and a RAM, auxiliary storages holding programs and data, such as a hard disk, a processor which executes the programs, communication and control interfaces for connecting peripheral apparatuses and devices, an input device for communicating with a measurer, and a display.

Specifically, the controller 19 performs the automatic measurement of EMI through execution of a built-in program by a built-in processor according to an instruction of the measurer by controlling the rotation of the turntable 11 and thus the equipment 12 under test and the vertical movement of the antenna 14 on the antenna mast 13 (position control step), causing the EMI receiver 16 to perform a fast Fourier transform measurement step, or obtaining the results of measurement by the EMI receiver. Here, the fast Fourier transform measurement step refers to a step of dividing the measurement frequency range into frequency subranges by the fast Fourier transform bandwidth, and performing measurement including detection of a peak and detection of a quasi-peak by the fast Fourier transform by the EMI receiver 16 on the radiated emission received by the antenna 14 while sequentially switching the frequency subranges after the division (each of the several frequency subranges after the division is defined as a measurement frequency range), where the frequency bandwidth enabling the one fast Fourier transform by the EMI receiver 16 is defined as a fast Fourier transform bandwidth.

At this time, for example, in the fast Fourier transform measurement step, the controller 19 controls the turntable 11 as follows: The measurement is performed in a first frequency subrange of the fast Fourier transform bandwidth as a target while the equipment 12 under test is being rotated continuously or stepwise by the turntable 11. In the next step, the measurement is performed on another target, i.e., in a second frequency subrange adjacent to one frequency subrange of the fast Fourier transform bandwidth while the equipment 12 under test is being rotated continuously or stepwise by the turntable 11. The measurement by the stepwise rotation is performed through the repetition of an operation to rotate the turntable 11 only by a predetermined angle (for example, 10 degrees), and perform measurement while the turntable 11 is paused.

The controller 19 controls the antenna mast 13 as follows: For example, the antenna 14 on the antenna mast 13 is set at a first height in the position control step, and the fast Fourier transform measurement step is performed. The antenna 14 on the antenna mast 13 is then moved to a second height in the position control step, and the fast Fourier transform measurement step is performed.

The fast Fourier transform measurement step includes the case where the fast Fourier transform bandwidth is equal to or higher than the bandwidth in the measurement frequency range, and the measurement in the measurement frequency range is completed by the one fast Fourier transform.

In the fast Fourier transform measurement step, the controller 19 controls such that the EMI receiver 16 performs the broadband measurement, which is the measurement including detection of a peak and detection of a quasi-peak, in the target measurement frequency range by the one fast Fourier transform by the EMI receiver 16 (prescan measurement step). The controller 19 obtains the data, which is obtained in the broadband measurement, from the EMI receiver 16, and based on the obtained data, calculates the difference between the peak and the quasi-peak obtained in the broadband measurement for a measurement frequency to be a candidate for the result of measurement in the target measurement frequency range (calculation step). The controller 19 determines whether the difference obtained by the calculation is less than a reference value predetermined corresponding to the measurement frequency (determination step). When determining that the difference is less than the reference value, the controller 19 outputs the result obtained in the broadband measurement onto a display as a final interference level of the radiated emission. When determining that the difference is equal to or higher than the reference value, the controller 19 controls such that the EMI receiver 16 performs narrowband measurement, which is measurement by the fast Fourier transform in a target measurement frequency in a frequency range narrower than the target measurement frequency range. The controller 19 obtains the result, which is obtained in the narrowband measurement, from the EMI receiver 16, and outputs the result onto the display as a final interference level of the radiated emission (output step).

An operation (or a radiated emission measurement method) of the radiated emission measurement system 10 according to the present embodiment having such a configuration will now be described.

Figure 5:
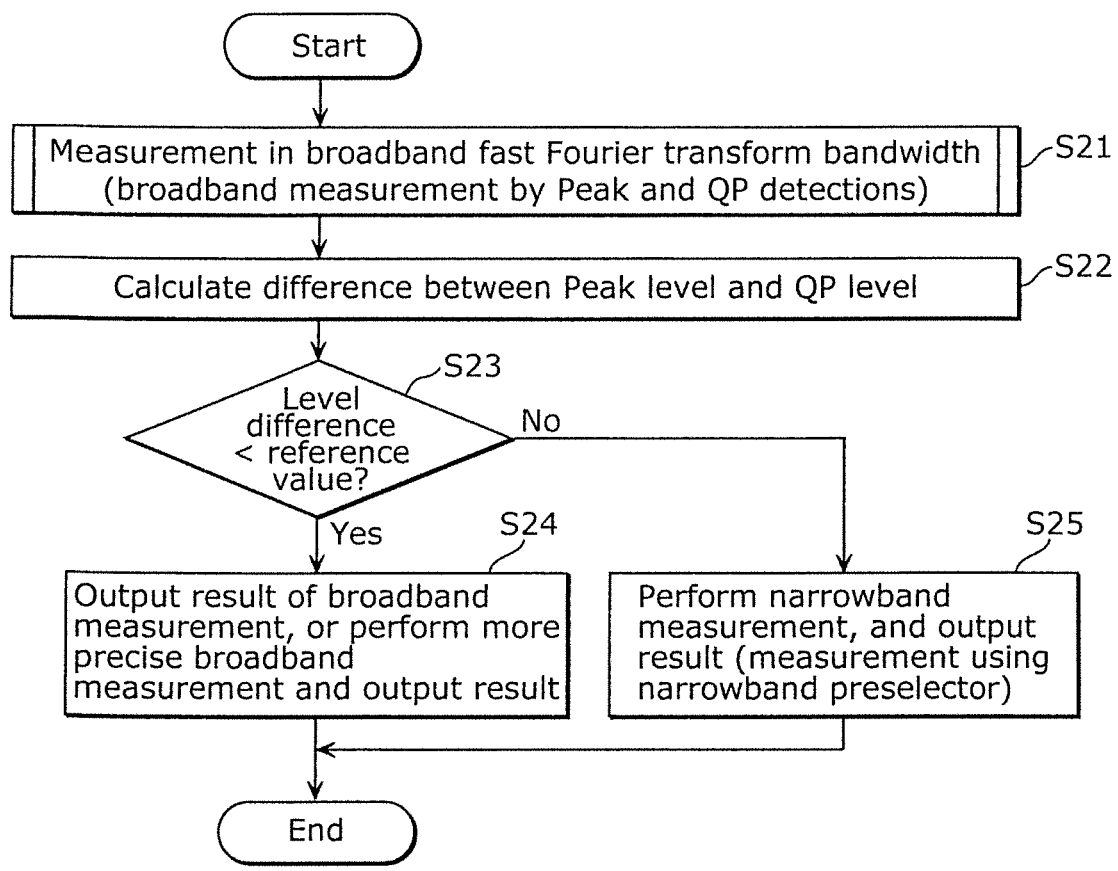
FIG. 5 is a flowchart illustrating an operation of the radiated emission measurement system according to the embodiment.

FIG. 5 is a flowchart illustrating an operation of the radiated emission measurement system 10 according to the present embodiment.

First, the controller 19 controls such that the EMI receiver 16 performs broadband measurement including detection of a peak and detection of a quasi-peak in a target measurement frequency range (here, each of first to fourth frequency subranges) by measurement in a broadband fast Fourier transform bandwidth (i.e., one fast Fourier transform) (prescan measurement step S21). Specifically, the controller 19 causes the EMI receiver 16 to perform the broadband measurement in the target measurement frequency range (here, each of the first to fourth frequency subranges) by the one fast Fourier transform where the fast Fourier transform bandwidth is 50 MHz. Details of the prescan measurement step S21 will be described later with reference to FIG. 6.

In the next step, the controller 19 selects one or more measurement frequencies to be any candidates for the result of measurement from the target measurement frequency range (here, the first to fourth frequency subranges), and calculates the difference in level between the peak and the quasi-peak obtained in the broadband measurement for each of the measurement frequencies selected (calculation step S22). Here, the term "measurement frequency to be a candidate for the result of measurement in the target measurement frequency range" refers to a frequency used as a final result of measurement, for example, frequencies at several (e.g., five) peaks sequentially selected in descending order from the highest peak in the spectrum of the quasi-peak obtained in the broadband measurement.

The controller 19 then determines whether the difference obtained in the calculation is less than a reference value predetermined corresponding to the measurement frequency (determination step S23). Here, the reference value refers to a value shown in the table of FIG. 3. In other words, the reference value is 7 dB at a measurement frequency of 9 kHz to 150 kHz (Band A), 13 dB at a measurement frequency of 150 kHz to 30 MHz (Band B), 21 dB at a measurement frequency of 30 MHz to 300 MHz (Band C), or 21 dB at a measurement frequency of 300 MHz to 1000 MHz (Band D). In the present embodiment, a reference value of 21 dB is used because the target measurement frequency range is 100 MHz to 300 MHz (Band C).

As a result, when determining that the difference obtained in the calculation step S22 is less than the reference value in each of the measurement frequencies (Yes in the determination step S23), the controller 19 outputs the result obtained in the broadband measurement onto a display as a final interference level of the radiated emission (S24). At this time, the controller 19 may output the result obtained by performing broadband measurement on a condition different from that of the broadband measurement in the prescan measurement step S21, as a final interference level of the radiated emission. For example, in the prescan measurement step S21, the controller 19 may cause the EMI receiver 16 to perform simple broadband measurement only for determining whether the pulse response characteristics are satisfied or not. After determining that the pulse response characteristics are satisfied (Yes in the determination step S23), the controller 19 may cause the EMI receiver 16 to perform precise broadband measurement for the determination of conformance required by the standards, and may output the result from the precise broadband measurement onto the display as a final interference level of the radiated emission.

In contrast, when determining that the difference obtained in the calculation step S22 is equal to or higher than the reference value for each of the measurement frequencies (No in the determination step S23), the controller 19 controls such that the EMI receiver 16 performs narrowband measurement, which is measurement by the fast Fourier transform targeting the measurement frequency in a frequency range narrower than the target measurement frequency range, obtains the result, which is obtained in the narrowband measurement, from the EMI receiver 16, and outputs the result onto the display as a final interference level of the radiated emission (S25). Specifically, the controller 19 controls such that the EMI receiver 16 performs the narrowband measurement on each of the measurement frequencies as a target (for example, the frequencies having peaks having the differences obtained in the calculation step S22 and determined to be equal to or higher than the reference value, among frequencies having five peaks sequentially selected in descending order from the highest peak in the spectrum of the quasi-peak obtained in the broadband measurement) by the peak detection and quasi-peak detection using a narrowband preselector, and outputs the result obtained in the narrowband measurement onto the display as an interference level of the radiated emission.

Figure 6:
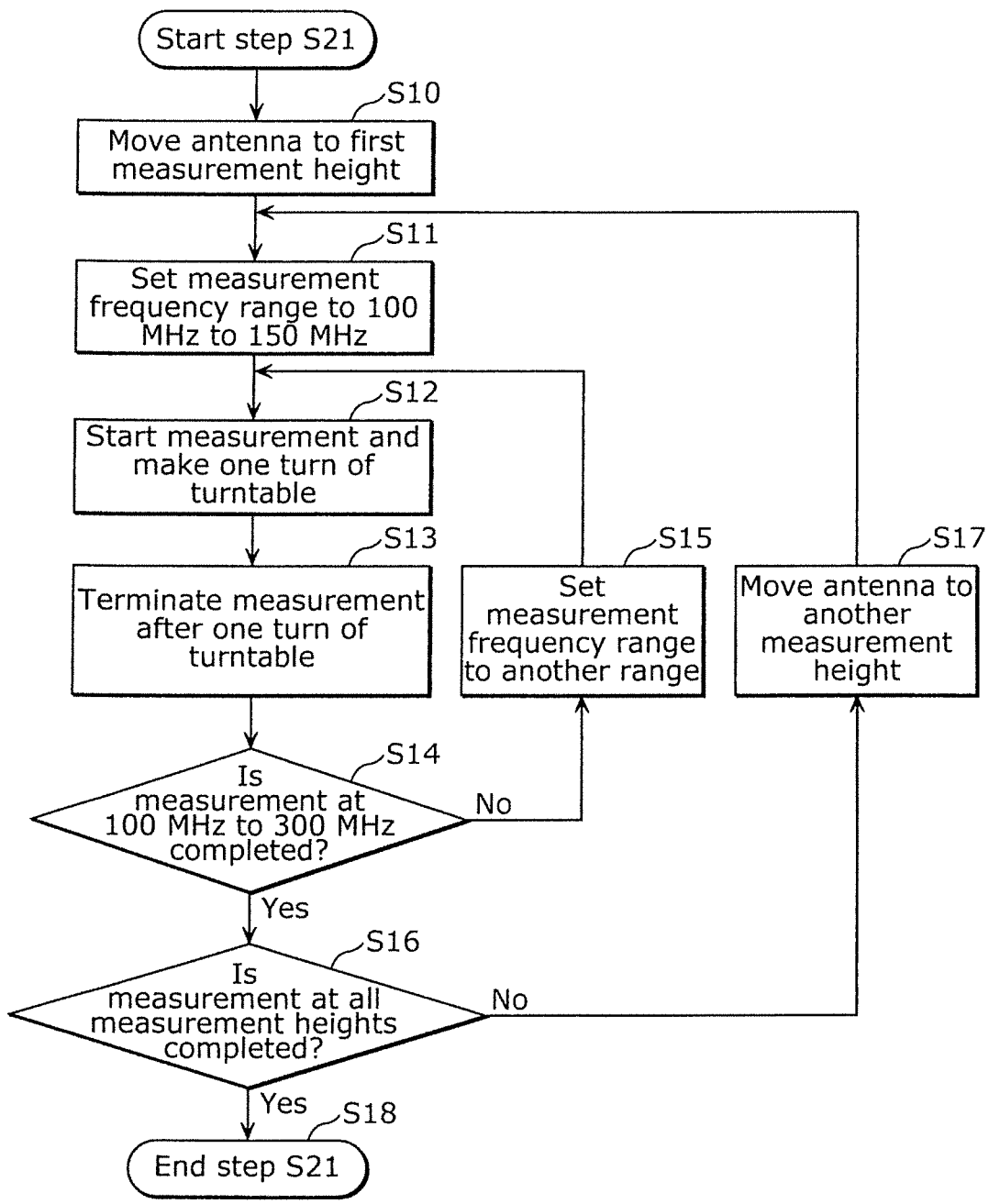
FIG. 6 is a flowchart illustrating a detailed procedure of a prescan measurement step S21 in FIG. 5.
Figure 7:
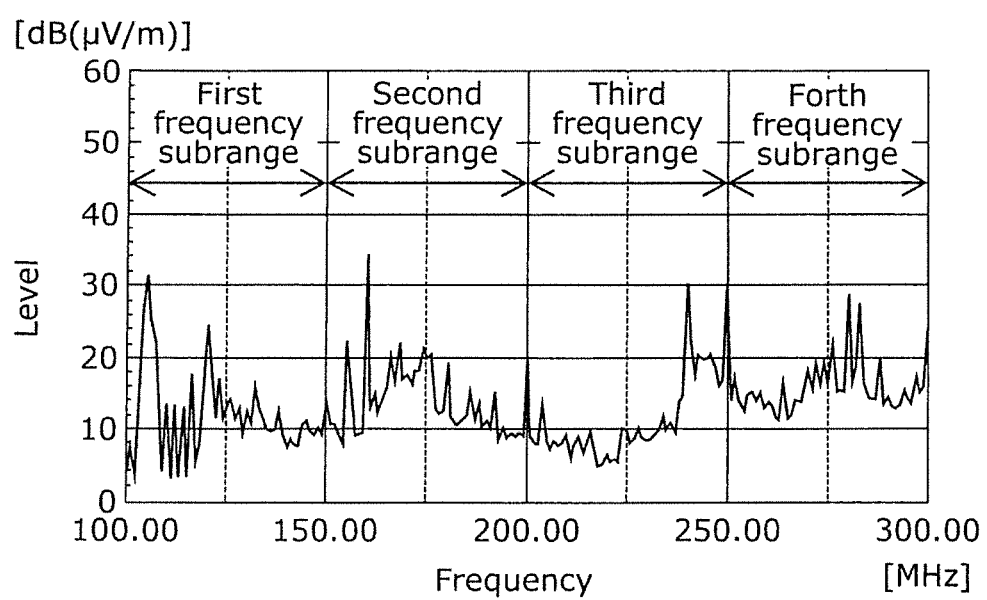
FIG. 7 is a diagram illustrating one example of a spectrum obtained by measurement by the radiated emission measurement system according to the embodiment.

FIG. 6 is a flowchart illustrating a detailed procedure of a prescan measurement step S21 in FIG. 5. FIG. 7 is a diagram illustrating one example of a spectrum obtained by the measurement by the radiated emission measurement system 10 according to the present embodiment (i.e., a spectrum displayed on the display of the controller 19). Here, an example of the operation is illustrated, where the fast Fourier transform bandwidth of the EMI receiver 16 is 50 MHz, the measurement frequency range from 100 MHz to 300 MHz is divided into four subranges, and the radiated emission measurement is performed by sequentially switching the divided four frequency subranges.

When a measurement frequency range of 100 MHz to 300 MHz for the EMI measurement is input, as initial processing, the controller 19 calculates four frequency subranges (a first frequency subrange (100 MHz to 150 MHz), a second frequency subrange (150 MHz to 200 MHz), a third frequency subrange (200 MHz to 250 MHz), and a fourth frequency subrange (250 MHz to 300 MHz)) by dividing the measurement frequency range by the fast Fourier transform bandwidth (50 MHz).

First, by controlling the antenna mast 13 through the turntable/antenna mast controller 18, the controller 19 vertically moves the antenna 14 such that the antenna 14 is located at a first measurement height (S10).

In the next step, the controller 19 sets the frequency range for measurement by the EMI receiver 16 (i.e., a prescan measurement frequency range) at a first frequency range from 100 MHz to 150 MHz (first frequency subrange) by controlling the EMI receiver 16 (S11).

In the next step, by controlling the EMI receiver 16, the controller 19 starts the measurement by the EMI receiver 16 (here, the measurement including a peak and a quasi-peak), and through the turntable/antenna mast controller 18, the turntable 11 is caused to make one turn (S12). The turntable 11 may rotate continuously, or may rotate stepwise. In the case where the turntable 11 rotates stepwise, the measurement is performed when the turntable 11 stops.

When the turntable 11 makes one turn, the controller 19 terminates the measurement by the EMI receiver 16 by controlling the EMI receiver 16. The controller 19 obtains the result from the measurement by the EMI receiver 16, and displays the result on the display (S13). Thereby, the measurement in the first target frequency subrange (100 MHz to 150 MHz) is completed (see the first frequency subrange in FIG. 7).

In the next step, the controller 19 determines whether the measurement in the target measurement frequency range of 100 MHz to 300 MHz is completed or not (S14). As a result, the controller 19 determines, at this stage, that the measurement is not completed (No in S14). By controlling the EMI receiver 16, the controller 19 sets the frequency range for measurement by the EMI receiver 16 (i.e., prescan measurement frequency range) to the next frequency range from 150 MHz to 200 MHz (second frequency subrange) (S15) to restart the measurement. The controller 19 causes the turntable 11 to make one turn (S12), and terminates the measurement (S13). In other words, the measurement goes to the next frequency range. After the measurement is completed, the result from the measurement by the EMI receiver 16 is obtained, and is displayed on the display. Thereby, the measurement in the second target frequency subrange (150 MHz to 200 MHz) is completed (see the second frequency subrange in FIG. 7).

The measurement in the third target frequency subrange (200 MHz to 250 MHz) and that in the fourth target frequency subrange (250 MHz to 300 MHz) are completed in the same manner as above (see the third and fourth frequency subranges in FIG. 7).

When the measurement in the fourth target frequency subrange (250 MHz to 300 MHz) is completed, the controller 19 determines that the measurement in the target measurement frequency range of 100 MHz to 300 MHz is completed (Yes in S14), and subsequently determines whether the measurement at all the measurement heights is completed or not (S16).

As a result, the controller 19 determines, at this stage, that the measurement at all the measurement heights is not completed (No in S16). By controlling the antenna mast 13 through the turntable/antenna mast controller 18, the controller 19 moves (i.e., vertically moves) the antenna 14 such that the antenna 14 is located at the next measurement height (S17). Subsequently, the same measurement as that at the initial measurement height is repeated (S11 to S16). Thereby, the measurement in the target measurement frequency range of 100 MHz to 300 MHz is performed at the next measurement height.

Thus, in the case where the measurement at all the measurement heights is completed (Yes in S16), the controller 19 terminates the prescan measurement step S21 in FIG. 5 (S18).

According to the measurement illustrated in FIGS. 5 and 6, the measurement which utilizes the measurement in the broadband fast Fourier transform bandwidth and satisfies the pulse response characteristics required by the CISPR 16-1-1 standards is completed.

As described above, the radiated emission measurement method according to the present embodiment is a method of measuring a radiated emission from the equipment 12 under test in a target measurement frequency range, the method including the prescan measurement step S21 of performing broadband measurement, which is measurement including detection of a peak and detection of a quasi-peak, on the radiated emission in the target measurement frequency range by one fast Fourier transform by the EMI receiver 16; the calculation step S22 of calculating the difference in level between the peak and the quasi-peak obtained in the prescan measurement step S21 for the measurement frequency to be a candidate for the result of measurement in the target measurement frequency range; the determination step S23 of determining whether the difference obtained in the calculation step S22 is less than the reference value predetermined corresponding to the measurement frequency; and an output step of outputting the result obtained in the broadband measurement as an interference level of the radiated emission when it is determined in the determination step S23 that the difference is less than the reference value (S24), and performing the narrowband measurement, which is measurement by the fast Fourier transform by the EMI receiver 16 targeting the measurement frequency in a frequency range narrower than the target measurement frequency range, when it is determined in the determination step that the difference is equal to or higher than the reference value, and outputting the result obtained in the narrowband measurement as the interference level of the radiated emission (S25).

Thereby, first, the broadband measurement using the EMI receiver 16 of a fast Fourier transform system is temporarily performed, and it is determined from the obtained data whether the pulse response characteristics required by the standards are satisfied or not. In the case where the pulse response characteristics are satisfied, the result of the broadband measurement temporarily performed can be used as the result of measurement of the final interference level of the radiated emission. Accordingly, in many cases where pulse noises at low repetition frequencies do not occur, the result of the broadband measurement temporarily performed can be used as the result of measurement of the final interference level of the radiated emission, and use of the EMI receiver 16 of a fast Fourier transform system enables high-quality and high-speed measurement without missing impulsive noise.

The prescan measurement step, the calculation step, the determination step, and the output step all are processings that can be performed by the EMI receiver 16 of a fast Fourier transform system and the controller 19 connected to the EMI receiver 16 through a communication path. The series of these steps automated using a computer, for example, enables utilization of the measurement in the broadband fast Fourier transform bandwidth and the determination of conformance which satisfies the pulse response characteristics required by the standards, without complex and difficult operations such as manual operation of the EMI receiver 16 or replacement thereof with an EMI receiver of a different type.

In the case where it is determined in the determination step S23 that the difference is less than the reference value, a result obtained by performing broadband measurement on a condition different from that of the broadband measurement in the prescan measurement step S21 may be output as a final interference level of the radiated emission in the output step.

Thereby, in the prescan measurement step S21, simple broadband measurement only for determining whether the pulse response characteristics required by the standards are satisfied or not can be performed; after it is determined that the pulse response characteristics are satisfied, precise broadband measurement for determination of conformance required by the standards can be performed. In total, determination of conformance to the standards can be performed in a short time with higher precision.

In the case where it is determined in the determination step S23 that the difference is equal to or higher than the reference value, the narrowband measurement is performed in the output step by using a preselector which is a filter which passes only signals in a frequency range narrower than the measurement frequency range.

Thereby, use of the preselector disposed at the input stage of the EMI receiver 16 enables the measurement by the EMI receiver 16 of a fast Fourier transform system where the pulse response characteristics are satisfied.

The determination step S23 is performed using the reference values of 7 dB, 13 dB, and 21 dB at measurement frequencies of 9 kHz to 150 kHz, 150 kHz to 30 MHz, and 30 MHz to 1000 MHz, respectively.

Thereby, in accordance with the CISPR 16-2-3 standards, it can be determined whether measurement which satisfies the pulse response characteristics having a repetition frequency of 20 Hz or more is successfully performed or not, enabling the measurement which satisfies the pulse response characteristics in accordance with the CISPR standards.

Moreover, the radiated emission measurement system according to the present embodiment is a system which measures a radiated emission from the equipment 12 under test in a target measurement frequency range, the system including an EMI receiver 16 which performs broadband measurement, which is measurement including detection of a peak and detection of a quasi-peak, on the radiated emission in the target measurement frequency range by one fast Fourier transform; and the controller 19 connected to the EMI receiver 16 through a communication path. The controller 19 obtains the data, which is obtained in the broadband measurement, from the EMI receiver 16. Based on the obtained data, the controller 19 calculates the difference in level between the peak and the quasi-peak obtained in the broadband measurement for the measurement frequency to be a candidate for the result of measurement in the target measurement frequency range. The controller 19 determines whether the difference obtained in the calculation is less than the reference value predetermined corresponding to the measurement frequency. When determining that the difference is less than the reference value, the controller 19 outputs the result obtained in the broadband measurement as the interference level of the radiated emission. When determining that the difference is equal to or higher than the reference value, the controller 19 controls such that the EMI receiver 16 performs narrowband measurement, which is measurement by fast Fourier transform targeting the measurement frequency in a frequency range narrower than the target measurement frequency range, obtains the result obtained in the narrowband measurement from the EMI receiver 16, and outputs the result as the interference level of the radiated emission.

Such use of the EMI receiver 16 and the controller 19 results in automation of the determination of conformance which satisfies the pulse response characteristics required by the standards while the measurement in the broadband fast Fourier transform bandwidth is utilized.

The radiated emission measurement method according to the present embodiment may be implemented as a program executed by a computer or as a computer-readable recording medium, such as a CD-ROM, on which the program is recorded.

Use of a program which controls the EMI receiver 16 results in automation of the determination of conformance which satisfies the pulse response characteristics required by the standards while the measurement in the broadband fast Fourier transform bandwidth is utilized.

Although the radiated emission measurement method and the radiated emission measurement system according to the present disclosure have been described based on the embodiment as above, the embodiment should not be construed as limitation to the present disclosure. A variety of modifications of the present embodiment conceived by persons skilled in the art and implemented without departing from the gist of the present disclosure, and different embodiments including the components of the present embodiment partially combined are also included in the scope of the present disclosure.

For example, although the measurement frequency range is divided into four subranges, and the measurement is sequentially performed in each of the four frequency subranges after the division as a target in the embodiment above, such scan in the measurement is not essential. In the case where the fast Fourier transform bandwidth is equal to or higher than the bandwidth in the entire measurement frequency range, the measurement of the entire measurement frequency range can be completed by the one fast Fourier transform.

Although the frequencies at several peaks sequentially selected in descending order from the highest peak in the spectrum of the quasi-peak obtained in the broadband measurement are used as the measurement frequencies to be candidates for the result of measurement in the target measurement frequency range in the embodiment above, any other candidate measurement frequency can be used. Only a frequency at the highest peak in the spectrum in the quasi-peak obtained in the broadband measurement can be used as the measurement frequency.

Although the controller 19 outputs the final result of measurement onto the display in the embodiment above, the final result can be output to any other device than the display, alternatively or additionally to this, the final result may be output as data to an external apparatus or device through a communication interface.

Although the operation to measure the radiated emission while rotating the turntable 11 at a fixed height of the antenna 14 is repeated at several heights of the antenna 14 in the embodiment above, any other operation can be used. Examples thereof include a method of repeating, at several angles of the turntable 11, the operation to measure a radiated emission while varying the height of the antenna 14 at a fixed angle of the turntable 11; a method of measuring a radiated emission while varying both the angle of the turntable 11 and the height of the antenna 14, and a method of measuring a radiated emission while fixing both the angle of the turntable 11 and the height of the antenna 14 for a predetermined time.

Although the turntable 11 is caused to make one turn and then the measurement frequency range is switched in the embodiment above, the measurement frequency range may be switched after the measurement at all the heights of the antenna 14 is completed.

Although the turntable 11 is caused to make one turn in the radiated emission measurement method according to the embodiment above, the turntable may turn at any other angle. The turntable 11 may rotate at an angle less than 360 degrees, or may make two or more turns.

Although the fast Fourier transform bandwidth is 50 MHz and the measurement frequency range is 100 MHz to 300 MHz in the example of measurement described in the embodiment above, these numeric values are only examples, and the fast Fourier transform bandwidth and the measurement frequency range can have any other numeric values. The fast Fourier transform bandwidth may have a different value from 50 MHz (for example, 100 MHz or 500 MHz). The measurement frequency range may be a range having a maximum frequency of 1 GHz or higher.

The radiated emission measurement method and the radiated emission measurement system according to the present disclosure can be used not only as a radiated emission measurement system of determining the conformance to the standards, i.e., whether the tolerance at a level specified in the CISPR 22 standards, for example, are satisfied or not, but also as an EMI apparatus which measures the peak, the quasi-peak, the average, and the square mean root value of a radiated emission in any measurement frequency range and in any radiation direction.

INDUSTRIAL APPLICABILITY

The present disclosure can be used as a radiated emission measurement system, particularly, as a radiated emission measurement system for determination of conformance where the pulse response characteristics required by the CISPR 16-1-1 standards are satisfied.

The invention claimed is:

1. A radiated emission measurement method of measuring a radiated emission from an equipment under test in a target measurement frequency range, the radiated emission measurement method comprising:
- performing broadband measurement on the radiated emission in the target measurement frequency range by one fast Fourier transform by an electro-magnetic interference (EMI) receiver, the broadband measurement being measurement including detection of a peak and detection of a quasi-peak;
- calculating a difference in level between the peak and the quasi-peak obtained in the performing for a measurement frequency to be a candidate for a result of measurement in the target measurement frequency range;
- determining whether the difference obtained in the calculating is less than a reference value predetermined corresponding to the measurement frequency; and
- outputting a result obtained in the broadband measurement as an interference level of the radiated emission when it is determined in the determining that the difference is less than the reference value, and performing narrowband measurement and outputting a result obtained in the narrowband measurement as the interference level of the radiated emission when it is determined in the determining that the difference is equal to or higher than the reference value, the narrowband measurement being measurement by fast Fourier transform by the EMI receiver targeting the measurement frequency in a frequency range narrower than the target measurement frequency range.

2. The radiated emission measurement method according to claim 1,
wherein when it is determined in the determining that the difference is less than the reference value, in the outputting, a result obtained by performing broadband measurement on a condition different from a condition for the broadband measurement in the performing is output as the interference level of the radiated emission.

3. The radiated emission measurement method according to claim 1,
wherein when it is determined in the determining that the difference is equal to or higher than the reference value, in the outputting, the narrowband measurement is performed by use of a preselector which is a filter through which only a signal in a frequency range narrower than the measurement frequency range passes.

4. The radiated emission measurement method according to claim 1,
wherein, in the determining, the determination is made using, as the reference value, 7 dB at a measurement frequency of 9 kHz to 150 kHz, 13 dB at a measurement frequency of 150 kHz to 30 MHz, and 21 dB at a measurement frequency of 30 MHz to 1000 MHz.

5. A non-transitory computer-readable recording medium having a program recorded thereon for causing a computer to execute the radiated emission measurement method according to claim 1.

6. A radiated emission measurement system which measures a radiated emission from an equipment under test in a target measurement frequency range, the radiated emission measurement system comprising:
- an electro-magnetic interference (EMI) receiver which performs broadband measurement on the radiated emission in the target measurement frequency range by one fast Fourier transform, the broadband measurement including detection of a peak and detection of a quasi-peak; and
- a controller connected to the EMI receiver through a communication path,
wherein the controller: obtains data from the EMI receiver, the data being obtained in the broadband measurement;
calculates, based on the data obtained, a difference in level between the peak and the quasi-peak obtained in the broadband measurement for a measurement frequency to be a candidate for a result of measurement in the target measurement frequency range;
determines whether the difference obtained in the calculation is less than a reference value predetermined corresponding to the measurement frequency; and
when the controller determines that the difference is less than the reference value, outputs a result obtained in the broadband measurement as an interference level of the radiated emission, and when the controller determines that the difference is equal to or higher than the reference value, controls such that the EMI receiver performs narrowband measurement, obtains a result, which is obtained in the narrowband measurement, from the EMI receiver, and outputs the result as the interference level of the radiated emission, the narrowband measurement being measurement by fast Fourier transform targeting the measurement frequency in a frequency range narrower than the target measurement frequency range.

* * * * *